US011573250B2

(12) United States Patent
Becker

(10) Patent No.: US 11,573,250 B2
(45) Date of Patent: Feb. 7, 2023

(54) ELECTRIC CIRCUIT ARRANGEMENT AND A METHOD FOR A GALVANICALLY INSULATED, AC/DC SENSITIVE DIFFERENTIAL-CURRENT MEASUREMENT HAVING HIGH RESOLUTION

(71) Applicant: Bender GmbH & Co. KG, Gruenberg (DE)

(72) Inventor: Pascal Becker, Gruenberg (DE)

(73) Assignee: Bender GmbH & Co. KG, Gruenberg (DE)

( * ) Notice: Subject to any disclaimer, the term of this patent is extended or adjusted under 35 U.S.C. 154(b) by 21 days.

(21) Appl. No.: 17/225,180

(22) Filed: Apr. 8, 2021

(65) Prior Publication Data
US 2021/0318359 A1 Oct. 14, 2021

(30) Foreign Application Priority Data
Apr. 9, 2020 (DE) ...................... 10 2020 110 000.0

(51) Int. Cl.
*G01R 15/18* (2006.01)
*G01R 19/10* (2006.01)
*H02M 7/217* (2006.01)

(52) U.S. Cl.
CPC ............. *G01R 15/18* (2013.01); *G01R 19/10* (2013.01); *H02M 7/217* (2013.01)

(58) Field of Classification Search
None
See application file for complete search history.

(56) References Cited

U.S. PATENT DOCUMENTS

2008/0106269 A1* 5/2008 Lewinski ............... H02H 3/335
324/509

FOREIGN PATENT DOCUMENTS

| EP | 2384922 A2 | 11/2011 |
| EP | 2813856 A1 | 12/2014 |

* cited by examiner

*Primary Examiner* — Jas A Sanghera
(74) *Attorney, Agent, or Firm* — Dickinson Wright PLLC; Andrew D. Dorisio

(57) ABSTRACT

An electric circuit arrangement and a measuring method for a galvanically insulated, AC/DC sensitive differential current measurement having a high resolution having: a toroid current transformer having at least one secondary winding for detecting a differential current; a driver circuit for powering the secondary winding; a first oscillator circuit for controlling the driver circuit and for generating a time-modulated binary oscillator signal having dwell times in a state 1 and a state 2; a second oscillator circuit for determining the corresponding dwell time in the states 1 and 2 in high resolution by means of a clock signal having a clock rate independent of the oscillator signal; an evaluation device for evaluating the dwell time; and a data interface for outputting a differential-current measuring value; the driver circuit and the second oscillator circuit each being realized as structurally individual, integrated circuits.

8 Claims, 3 Drawing Sheets

ELECTRIC CIRCUIT ARRANGEMENT AND A METHOD FOR A GALVANICALLY INSULATED, AC/DC SENSITIVE DIFFERENTIAL-CURRENT MEASUREMENT HAVING HIGH RESOLUTION

This application claims the benefit of German Patent Application No. 10 2020 110 000.0, filed Apr. 9, 2020, the disclosure of which is incorporated herein by reference.

TECHNICAL FIELD

The invention relates to an electric circuit arrangement and a method for a galvanically insulated, AC/DC sensitive differential-current measurement having a high resolution.

BACKGROUND

The known measuring devices and measuring methods for monitoring electric installations are devices and methods based on the principle of differential-current measurement.

Measuring devices of this kind are based on the fact that the vectorial sum of the currents (primary current) equals zero for all active conductors of a supply line, for example the line of a power supply system, when the operation of an electric installation is fault-free and wherefore a magnetic field does not exist in a magnetizable toroid of a measuring-current transformer encircling the supply line. If a fault current arises because of an insulation fault, for example, which drains outside of the supply line, a differential current is yielded on the supply side. The changing magnetic flux caused by this differential current within the toroid induces a voltage in a secondary winding of the measuring-current transformer, the size of the voltage allowing drawing conclusions about the magnitude of the differential current.

If the differential current is particularly small or if small changes have to be recorded when the differential current is large, a measuring device having high sensitivity is required. For certain applications, for example for detecting a test-current impulse in an ungrounded power supply system, it can therefore be necessary to be able to detect particularly small differential currents in a range smaller than 1 mA or even smaller than 10 μA.

Limiting the measuring resolution in this manner leads to a second (fault-current) path having to be switched to ground when, for example, determining a faulty outgoing power feed in an ungrounded power supply system in order for a significant measurable differential current to be able to flow through the measuring-current transformer. This approach, however, can be unreliable in certain scenarios for technical and regulatory reasons.

Known methods for an AC/DC sensitive differential-current measurement by means of a measuring-current transformer, as disclosed in EP 2 813 856 B 1, use oscillator circuits which oscillatingly pass the magnetizing curve of the core of the measuring-current transformer between an upper and a lower saturation via a controlled secondary-side current flow. From the temporal progression of this oscillation, two states can be defined and a measuring parameter can be formed by having determined the dwell times in the corresponding states, the supply-side differential current being able to be determined from the measuring parameter via the measuring-current transformer. However, an application-specific integrated circuit (ASIC) comes to use in the mentioned Document which entails much development effort and high initial costs.

Other known circuit arrangements for measuring differential current in the broadest sense are also based on integrated circuits and consequently form a structural and functional unit which requires much development effort because of its complexity.

The object of the invention at hand is therefore to devise an electric circuit arrangement and a measuring method for a galvanically insulated, AC/DC sensitive differential-current measurement which both allow a high-resolution measurement of the differential current and can simultaneously be implemented efficiently from an economic and circuitry-related point of view.

SUMMARY

This object is attained via an electric circuit arrangement for a galvanically insulated, AC/DC sensitive differential-current measurement, the electric circuit arrangement comprising the following elements: a toroid current transformer having at least one secondary winding for detecting a differential current; a driver circuit for powering the secondary winding; a first oscillator circuit for controlling the driver circuit and for generating a time-modulated binary oscillator signal having dwell times in a state 1 and a state 2; a second oscillator circuit for determining the corresponding dwell time in the states 1 and 2 in high resolution by means of a clock signal having a clock rate independent of the oscillator signal; and a data interface for outputting a differential-current measuring value; the driver circuit and the second oscillator circuit each being realized as structurally individual, integrated circuits.

The invention presumes a toroid current transformer for detecting the differential current whose magnetizing curve has a considerable positive and negative saturation range between which an approximately linear area extends. The toroid current transformer comprises at least one secondary winding which is powered by a driver circuit.

The driver circuit is controlled by the first oscillator circuit in such a manner that the magnetizing curve is oscillatingly passed between the positive and the negative saturation in both directions as a consequence of the current flow.

This is enabled by a driver circuit which inverts the polarity of the voltage applied to the secondary winding. The differentiation between the linear area and the corresponding saturation area on the magnetizing curve takes place in the first oscillation circuit via an absolute measurement of the secondary current and via the comparison to a sufficiently high saturation threshold which corresponds to a current value in the saturation area of the core material. The secondary current is coupled back for this purpose.

If the secondary current exceeds the saturation threshold, the first oscillator circuit (flipflop circuit) is triggered. The polarity at the secondary winding is then inverted and the magnetic flux in the toroid is driven out of the saturation area of that moment all the way to the corresponding opposite saturation.

From evaluating the zero crossings of the secondary current (i.e., in the operating point on the magnetizing curve determined solely via the differential current) and from its changeover points (i.e., in the saturation areas on the magnetizing curve), a binary oscillator signal having dwell times in a state 1 (high phase) and in a state 2 (low phase) can be derived from the progression of the secondary current.

The dwell times in state 1 and in state 2 have different durations starting from the operating point on the magnetizing characteristic specified via the differential current until reaching the respective saturation point as a function of the position of the operating point and therefore lead to a time-modulated oscillator signal.

The passing through the magnetizing curve is mapped by a function as linear as possible (linear area of the magnetizing curve) in the dwell times of the binary oscillator signal, the dwell times corresponding to the passed paths on the magnetizing curve being derived as a function of the operating point.

Depending on the position of the operating point and thus as a function of the differential current, the time-modulated binary oscillator signal therefore has varying durations of the high phase and low phase (state 1 and state 2, respectively).

The corresponding dwell time in the states 1 and 2 are determined by means of a second oscillator circuit which generates a high-frequency clock signal. This clock signal is independent of the oscillator signal, though its clock rate is a multitude larger than a basic frequency of the oscillator signal and resides in a range larger than 1 GHz. This advantageously allows a high temporal resolution in a range smaller than 1 ns so that small differences in the dwell times and thus particularly small differential currents and particularly small changes in the differential current can be detected.

The number of the clock pulses counted in the second oscillator circuit during the corresponding dwell times having the clock rate is determined in the evaluation device and leads to a differential-current measuring value proportional to the differential current after appropriate signal processing (filtering).

Via the data interface, the differential-current measuring value is output in digital and/or analog form.

According to the invention, the electric circuit arrangement is structured in a modularly manner so that the driver circuit and the second oscillator circuit are each realized as structurally individual, integrated circuits.

Both the driver circuit and the second oscillator circuit are therefore realized as separately available, integrated circuits (standard components), the second oscillator circuit in particular enabling determining the corresponding dwell times in high resolution as a consequence of the high clock rate.

With technical advantage of a high-frequency clock rate and the high measurement resolution resulting therefrom comes economic efficiency when using selected standard components.

In another advantageous embodiment, the second oscillator circuit consists of a closed series circuit of inverting elements having at least one back coupling.

With this circuit structure, a higher clock rate is attainable than with a purely digital electronic generation of a clock signal, e.g., in a microcontroller, thus bringing with it an immense improvement in the measurement resolution without giving an upward limit of the measuring area—unlike in methods known from the state of the art.

A large dynamic range can be attained which allows detecting even small changes in the differential current in the wanted signal, such as a test-current impulse in an unwanted signal 10,000 times larger than the wanted signal.

Preferably, the evaluation device is configured as a digital circuit for generating the differential-current measuring value from the dwell times.

The evaluation device preferably comprises a microprocessor as a digital circuit on which methods for digital signal processing, such as filtering or averaging the dwell times, are implemented for computing the differential-current measuring value. For this purpose, different programmable filter characteristics and even an absolute differential-current measurement having calibration or zero balance can be provided.

Advantageously, the data interface for outputting the differential-current measuring value is configured as an analog and/or digital signal.

The differential-current measuring value is output as a digital signal and/or is available as an analog signal after D/A conversion.

The object of the invention is further attained by a measuring method for a galvanically insulated, AC/DC sensitive differential-current measurement.

The claimed measuring method describes the method steps forming the basis of the electric circuit arrangement according to the invention for determining the differential current in high resolution. Accordingly, the technical effects mentioned above pertaining to the electric circuit arrangement and the advantages resulting therefrom also apply to the method features.

In particular the driver circuit and the second oscillator circuit, which are each realized as structurally individual, integrated circuits, yield the high sensitivity and economical efficiency demanded by the object of the invention.

Further advantageous embodiment features are derived from the following description and the drawings which describe a preferred embodiment of the invention using an example.

BRIEF DESCRIPTION OF THE DRAWING FIGURES

In the figures.

DETAILED DESCRIPTION

Figure 1:
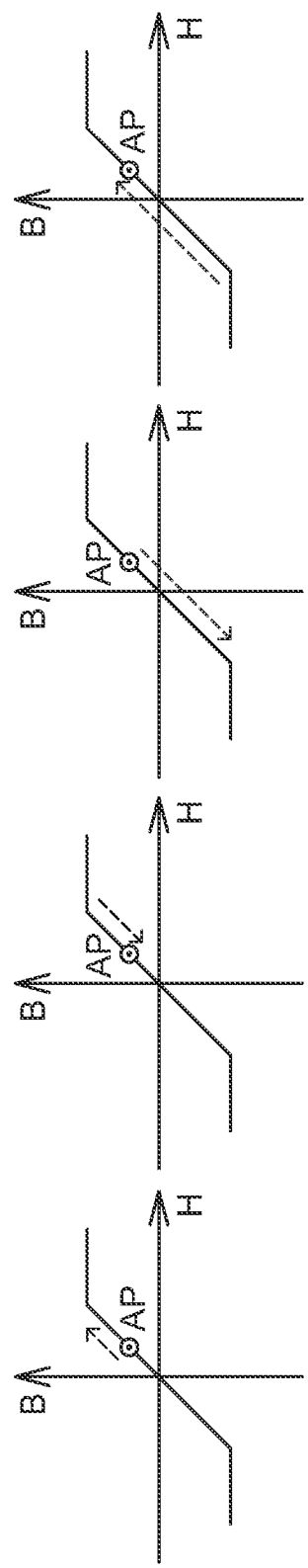
FIG. 1 shows a magnetizing curve of a toroid current transformer in a schematic illustration.

FIG. 1 shows the passing through the magnetizing curve of toroid current transformer 4 (FIG. 2) in a schematic manner.

The magnetizing curve illustrates magnetic induction B in dependence of magnetic field strength H and in this instance consists of a linear section which extends between an upper and a lower saturation range.

Starting from operating point AP predetermined by differential current $I_d$ (FIG. 2), an increasing current in the secondary winding (secondary current) first passes through the magnetizing curve in the direction of the positive saturation state. In operating point AP, the value of the current flowing in the secondary winding is zero so that operating point AP is only determined by differential current $I_d$ flowing on the supply side. The reaching of the saturation range is detected by an absolute measurement of the secondary current and by a comparison to a sufficiently high saturation threshold, which lies in the saturation range of the core material. If the secondary current exceeds this saturation threshold, the first oscillator circuit toggles. The polarity of the secondary winding is inverted and magnetic flux B in the core is driven out of the saturation range into the corresponding opposite saturation.

Figure 3:
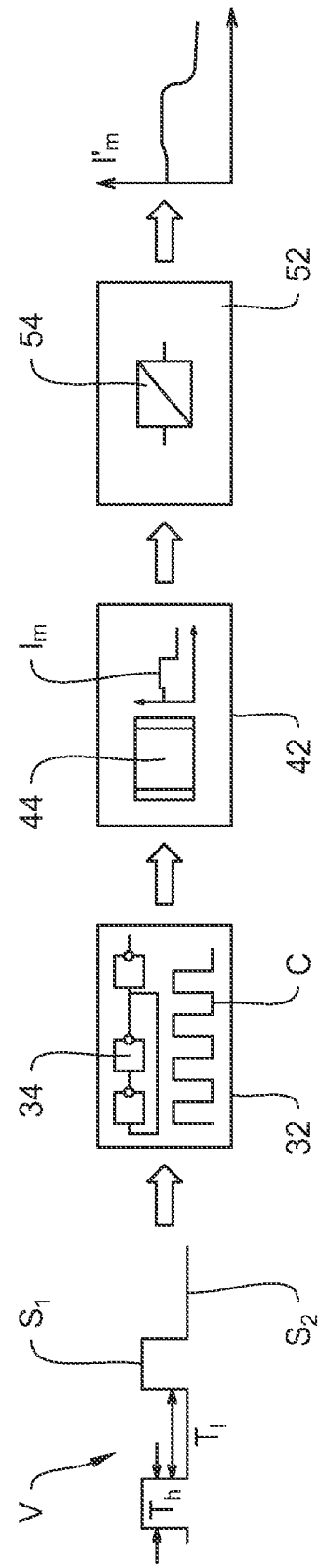
FIG. 3 shows digital signal processing of the oscillator signal.

Passing through the magnetizing curve makes apparent that the duration of an increasing/decreasing secondary current, i.e., dwell times $T_h$, $T_1$ (FIG. 3) depends on the position of operating point AP on the magnetizing curve. Knowledge of the zero point and the changeover points of the secondary current can therefore yield a time-modulated binary oscillator signal V (FIG. 3) having dwell times $T_h$, $T_1$ in a state 1 $S_1$ and a state 2 $S_2$ (FIG. 3).

Figure 2:
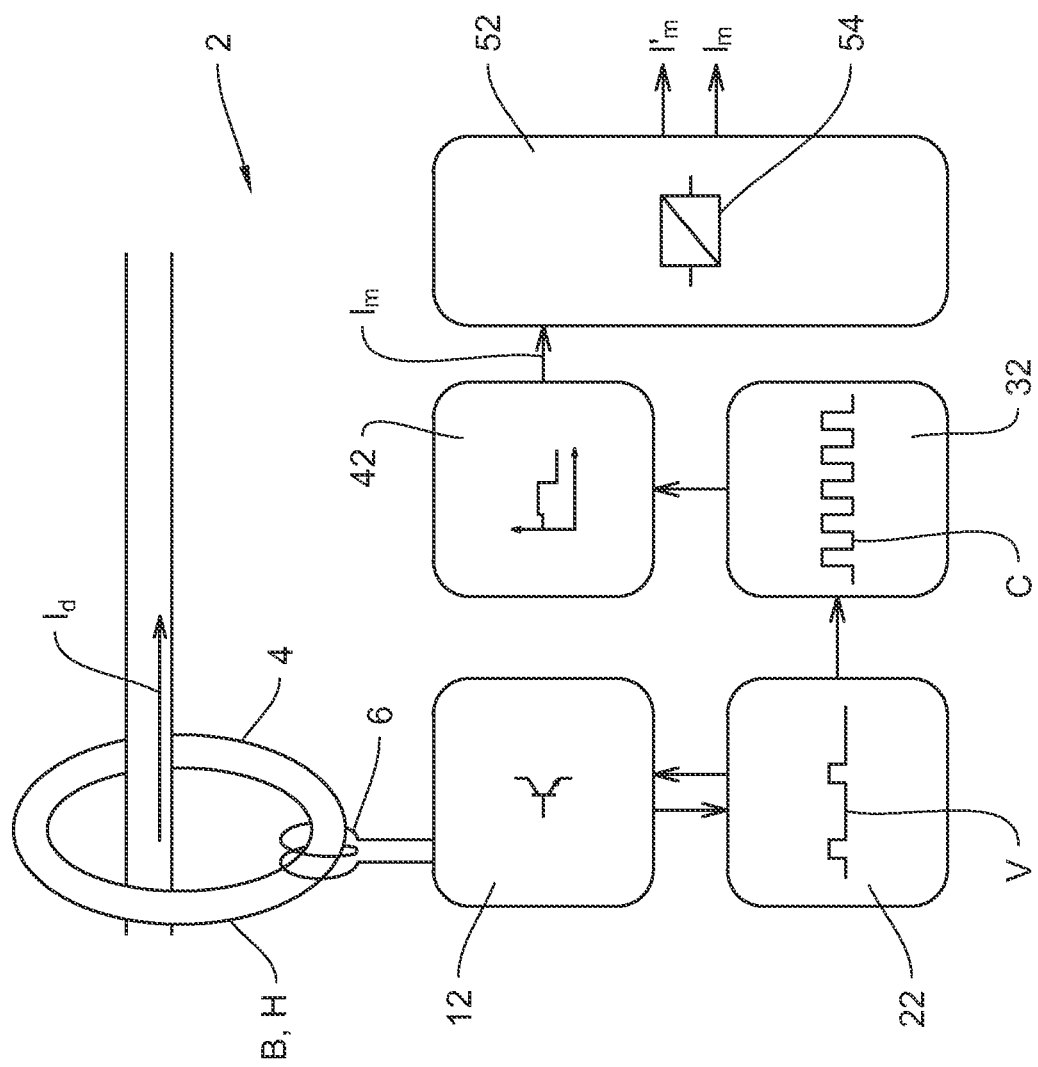
FIG. 2 shows a functional block diagram of the electric circuit arrangement according to the invention.

FIG. 2 shows a functional block diagram of electric circuit arrangement 2 according to the invention.

Differential current $I_d$ (primary current) to be measured is detected by a toroid current transformer 4, which leads to a specific operating point AP being set on the magnetizing curve (FIG. 1).

For passing through the magnetizing curve in both directions, toroid current transformer 4 comprises a secondary winding 6 which is powered by a driver circuit 12. Magnetic field strength H tied to the current flow in secondary winding 6 generates magnetic induction B in the core material.

Driver circuit 12 is controlled by a first oscillator circuit 22, an oscillator signal V being computed in secondary winding 6 by evaluating the zero points and the flipflops of the secondary current.

The passing of the magnetizing curve is thus mapped in dwell times $T_h$, $T_1$ (FIG. 3) having a state 1 $S_1$ (high phase) and having a state 2 $S_2$ (low phase), dwell times $T_h$, $T_1$ corresponding to the passed paths on the magnetizing curves being yielded in dependence of operating point AP prespecified by differential current $I_d$.

If, for example, operating point AP is close to the upper saturation point on the linear path section of the magnetizing curve as a consequence of a relatively high differential current $I_d$, a shorter path is taken on the linear section when passing the magnetizing curve starting from the operating point than when the differential current is low—the resulting dwell time is shorter. As described above, oscillator signal V time-modulated in this manner therefore comprises dwell times $T_h$, $T_1$ of different durations in states 1 $S_1$ and 2 $S_2$ depending on the position of operating point AP and thus as a function of differential current $I_d$.

Corresponding dwell times $T_h$, $T_1$ are determined in a second oscillator circuit 32 in high resolution by means of a high-frequency clock signal C whose clock rate is several degrees larger than a basic frequency of oscillator signal V oscillating between states 1 $S_1$ and 2 $S_2$. Examinations have shown that a clock rate larger than 1 GHz and thus a high temporal resolution of smaller than 1 ns is possible.

The clock impulses detected during corresponding dwell times $T_h$, $T_1$ are evaluated (counted) in an evaluation device 42 which provides a differential-current measuring value $I_m$ on the exit side proportional to differential current $I_d$. Digitally available differential-current measuring value $I_m$ can be output directly in a digital format $I_m$ via data interface 52 and/or as an analog differential-current measuring value $I'_m$ by means of a D/A converter 54.

FIG. 3 shows the digital signal processing of oscillator signal V in a functional block diagram.

Dwell times $T_h$, $T_1$ of oscillator signal V in states 1 $S_1$ and 2 $S_2$ are quantized in second oscillator circuit 32 in high (temporal) resolution by means of a high-frequency clock signal C. For this purpose, second oscillator circuit 32 comprises a closed series circuit of inverting elements having at least one back coupling 34.

Dwell times $T_h$, $T_1$ determined in this manner are evaluated in a downstream evaluation device 42 by means of a digital circuit 44, such as a microcontroller.

At the output of evaluation device 42, a differential-current measuring value $I_m$ is available. Data interface 52 forwards digital differential-current measuring value $I_m$ directly and/or via a D/A converter 54 as an analog differential-current measuring value $I'_m$.

The invention claimed is:

1. An electric circuit arrangement (2) for a galvanically insulated, AC/DC sensitive differential-current measurement, the electric circuit arrangement (2) comprising a toroid current transformer (4) having at least one secondary winding (6) for detecting a differential current ($I_d$),
   a driver circuit (12) for powering the secondary winding (6),
   a first oscillator circuit (22) for controlling the driver circuit (12) and for generating a time-modulated binary oscillator signal (V) having dwell times ($T_h$, $T_1$) in a state 1 ($S_1$) and a state 2 ($S_2$),
   a second oscillator circuit (32) for determining the corresponding dwell time ($T_h$, $T_1$) in the states 1 and 2 in high resolution of smaller than 1 ns by means of a clock signal (C) having a clock rate independent of the oscillator signal (V),
   an evaluation device (42) for evaluating the dwell time ($T_h$, $T_1$), and a data interface (52) for outputting a differential-current measuring value ($I_m$, $I'_m$),
   the driver circuit (12) and the second oscillator circuit (32) each being realized as structurally individual, integrated circuits.

2. The electric circuit arrangement (2) according to claim 1, wherein the second oscillator circuit (32) consists of a closed series circuit of inverting elements having at least one back coupling (34).

3. The electric circuit arrangement (2) according to claim 1, wherein the evaluation device (42) is configured as a digital circuit (44) for generating a differential-current measuring value ($I_m$) from the dwell times ($T_h$, $T_1$).

4. The electric circuit arrangement (2) according to claim 1, wherein the data interface (52) is configured as an analog and/or digital signal for outputting the differential-current measuring value ($I_m$, $I'_m$).

5. A measuring method for a galvanically insulated, AC/DC sensitive differential-current measurement, the measuring method comprising the following steps:
   detecting a differential current ($I_d$) by means of a toroid current transformer (4) having at least one secondary winding (6),
   powering the secondary winding (6) by means of a driver circuit (12) which is configured as a structurally individual, integrated circuit,
   controlling the driver circuit (12) and generating a time-modulated binary oscillator signal (V) having dwell times ($T_h$, $T_1$) in a state 1 ($S_1$) and in a state 2 ($S_2$) by means of a first oscillator circuit (22),
   determining the corresponding dwell time ($T_h$, $T_1$) in the states 1 and 2 ($S_1$, $S_2$) by means of a second oscillator circuit (32), which is realized as a structurally individual, integrated circuit, by generating a clock signal (C) having a clock rate which is independent of the oscillator signal (V) and causes a high temporal resolution of smaller than 1 ns,
   evaluating the dwell times ($T_h$, $T_1$) by means of an evaluation device (42),
   outputting a differential-current measuring value ($I_m$, $I'_m$) by means of a data interface.

6. The measuring method according to claim 5, wherein the clock signal (C) is generated by means of a closed series circuit of inverting elements having at least one back coupling (34).

7. The measuring method according to claim 5, wherein the differential-current measuring value ($I_m$) is computed in the evaluation device (42) from the dwell times ($T_h$, $T_1$) by means of digital filtering algorithms.

8. The measuring method according to claim 5, wherein the differential-current measuring value ($I_m$, $I'_m$) is output as an analog and/or digital signal by means of the data interface (52).

\* \* \* \* \*